United States Patent
Kim et al.

(10) Patent No.: US 11,921,579 B2
(45) Date of Patent: Mar. 5, 2024

(54) METHOD OF OPERATING MEMORY DEVICE, METHOD OF OPERATING MEMORY CONTROLLER AND MEMORY SYSTEM

(71) Applicant: SAMSUNG ELECTRONICS CO., LTD., Suwon-si (KR)

(72) Inventors: Ki-Heung Kim, Suwon-si (KR); Jun Hyung Kim, Suwon-si (KR); Chang-Yong Lee, Hwaseong-si (KR); Sang Uhn Cha, Suwon-si (KR); Kyung-Soo Ha, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 70 days.

(21) Appl. No.: 17/692,953

(22) Filed: Mar. 11, 2022

(65) Prior Publication Data

US 2023/0012525 A1 Jan. 19, 2023

(30) Foreign Application Priority Data

Jul. 15, 2021 (KR) ........................ 10-2021-0092846

(51) Int. Cl.
*G06F 11/10* (2006.01)
*G06F 3/06* (2006.01)
*G06F 11/07* (2006.01)

(52) U.S. Cl.
CPC ........ *G06F 11/1068* (2013.01); *G06F 3/0619* (2013.01); *G06F 3/0659* (2013.01); *G06F 3/0679* (2013.01); *G06F 11/076* (2013.01); *G06F 11/0772* (2013.01)

(58) Field of Classification Search
CPC .............. G06F 11/1068; G06F 11/076; G06F 11/0772; G06F 3/0619; G06F 3/0659; G06F 3/0679
See application file for complete search history.

(56) References Cited

U.S. PATENT DOCUMENTS

| | | |
|---|---|---|
| 7,818,651 B2 | 10/2010 | Nagai et al. |
| 8,683,290 B2 | 3/2014 | Koshiyama et al. |
| 9,406,355 B1 | 8/2016 | Chang et al. |
| 9,754,682 B2 * | 9/2017 | Mateescu ............... G11C 29/08 |
| 9,978,441 B2 | 5/2018 | Tanaka et al. |
| 10,020,073 B2 | 7/2018 | Kim et al. |
| 10,037,246 B1 | 7/2018 | Laws et al. |
| 10,198,221 B2 | 2/2019 | Cha et al. |
| 10,581,555 B2 * | 3/2020 | Maeda .................. G06F 3/0659 |
| 10,671,478 B2 | 6/2020 | Cha et al. |

(Continued)

FOREIGN PATENT DOCUMENTS

KR 10-1873526 B1 7/2018

*Primary Examiner* — Guy J Lamarre
(74) *Attorney, Agent, or Firm* — Sughrue Mion, PLLC

(57) ABSTRACT

A method of operating a memory device is provided. The method includes: receiving a first command from a controller; activating a page of a memory cell array based on the first command; reading data of the activated page; detecting an error from the read data; correcting the detected error to generate error correction data; writing back the error correction data to the activated page in based on the detected error being a single-bit error; and blocking write-back of the error correction data to the activated page based on the detected error being a multi-bit error.

17 Claims, 23 Drawing Sheets

(56) References Cited

U.S. PATENT DOCUMENTS

2014/0380116 A1* 12/2014 Hirano .................. G11C 29/78
714/758
2016/0239378 A1* 8/2016 Blake ...................... G06F 30/39

* cited by examiner

METHOD OF OPERATING MEMORY DEVICE, METHOD OF OPERATING MEMORY CONTROLLER AND MEMORY SYSTEM

CROSS-REFERENCE TO RELATED APPLICATION

This application claims priority from Korean Patent Application No. 10-2021-0092846 filed on Jul. 15, 2021 in the Korean Intellectual Property Office, the disclosure of which is incorporated by reference herein in its entirety.

BACKGROUND

1. Field

Methods, apparatuses and systems consistent with example embodiments relate to a memory device, a memory controller, and a memory system.

2. Related Art

Semiconductor memory devices, which are widely used in high-performance electronic systems, are increasing in both capacity and speed. As an example of the semiconductor memory devices, a dynamic random-access memory (DRAM) is a volatile-memory in which data is stored by storing an electric charge in a capacitor.

An error may occur while writing data to the semiconductor memory device, reading data from the semiconductor memory device, or storing data in the semiconductor memory device. For example, the error may be a single-bit error in which one of the data bits has an error, and a multi-bit error in which two or more bits have an error. Such errors may be corrected through an error correction circuit.

As an example, parity information may be generated from data to be read from the memory device or written to the memory device, and error detection and correction operations on the data may be performed through the parity information. When an error correction circuit having a single-bit error correction capability corrects the multi-bit error, data may be erroneously corrected.

SUMMARY

One or more example embodiments provide a method of operating a memory device that prevents accumulation of errors.

One or more example embodiments provide a method of operating a memory controller that prevents accumulation of errors.

One or more example embodiments provide a memory system that prevents accumulation of errors.

According to an aspect of an example embodiment, a method of operating a memory device includes: receiving a first command from a controller; activating a page of a memory cell array based on the first command; reading data of the activated page; detecting an error from the read data; correcting the detected error to generate error correction data; writing back the error correction data to the activated page in based on the detected error being a single-bit error; and blocking write-back of the error correction data to the activated page based on the detected error being a multi-bit error.

According to an aspect of an example embodiment, a method of operating a memory controller includes: transmitting a read-modify-write command to a memory device; receiving an error information signal indicating an error detected from data read from a memory cell array of the memory device, from the memory device; and providing the memory device with a write-back block signal to block the memory device from writing back an error correction data obtained by correcting the detected error to the memory cell array, based on the error information signal indicating the detected error is a multi-bit error.

According to an aspect of an example embodiment, a memory system includes: a memory controller; and a memory device including a plurality of bank arrays provided in a memory cell array, and an error correction circuit. The memory device is configured to perform a memory operation based on a first command received from the memory controller. The error correction circuit is configured to perform a scrubbing operation which includes detecting an error of data read from the memory cell array, correcting the detected error to generate error correction data, and writing back the error correction data to the memory cell array. The memory controller is configured to provide the memory device with a second command to block the scrubbing operation based on the error detected by the error correction circuit being a multi-bit error.

However, aspects of the present invention are not restricted to the one set forth herein. The and other aspects of the present invention will become more apparent to one of ordinary skill in the art to which the present invention pertains by referencing the detailed description of the present invention given below.

BRIEF DESCRIPTION OF THE DRAWINGS

The above and other objects, features and advantages will be more apparent form the following description, taken in conjunction with the accompanying drawings in which.

DETAILED DESCRIPTION

Hereinafter, example embodiments will be described referring to the accompanying drawings.

Figure 1:
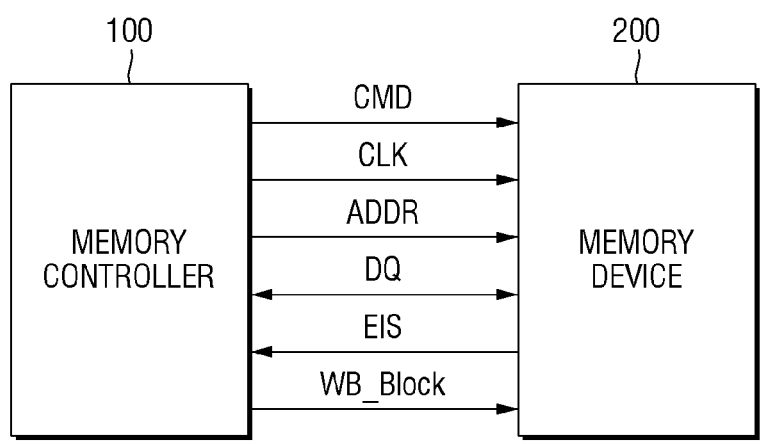
FIG. 1 is a diagram showing a memory system according to example embodiments.
Figure 2:
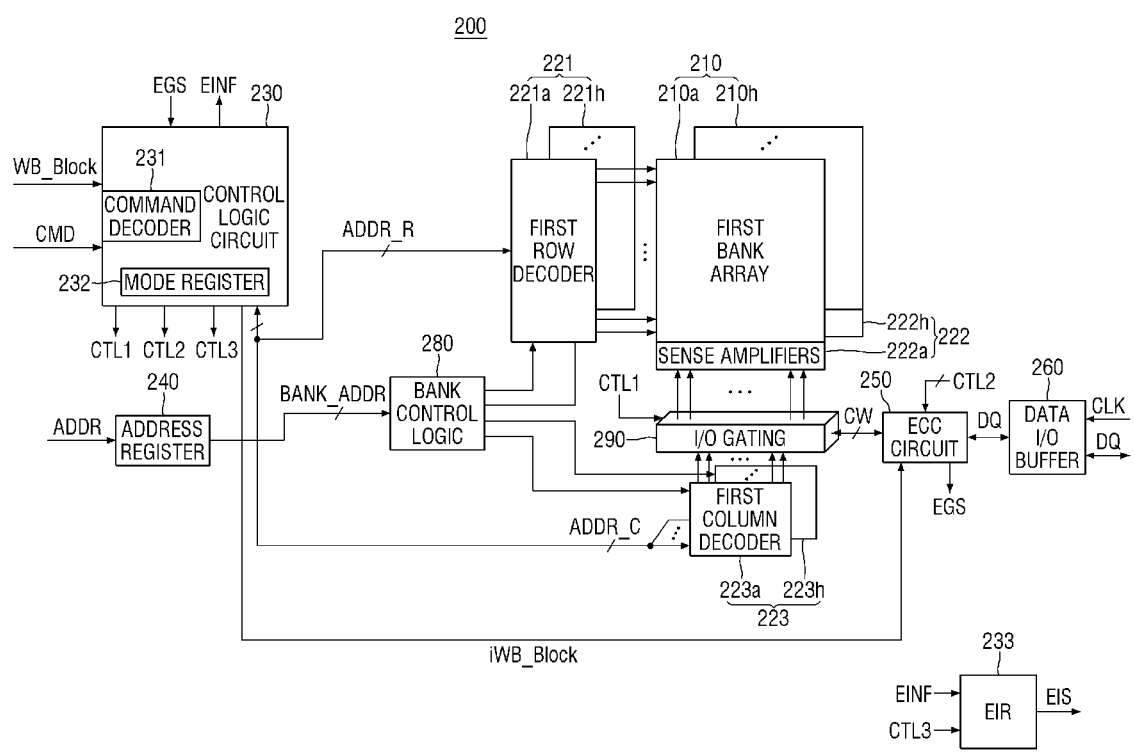
FIG. 2 is a diagram showing a memory device according to example embodiments.
Figure 3:
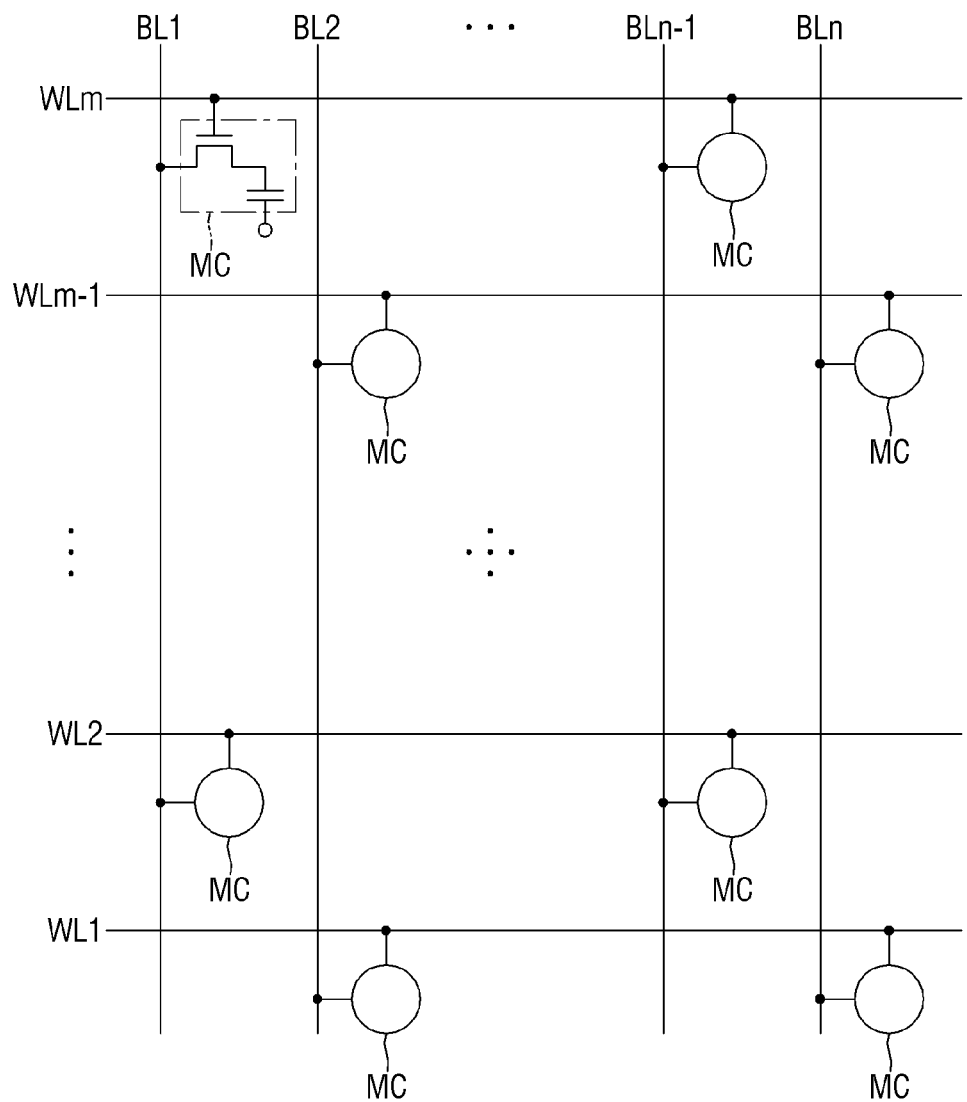
FIG. 3 is a diagram for explaining the memory cell array of FIG. 2.

FIG. 1 is a diagram showing a memory system according to example embodiments. FIG. 2 is a diagram showing a memory device according to example embodiments. FIG. 3 is a diagram for explaining the memory cell array of FIG. 2.

Referring to FIG. 1, a memory system 1 includes a memory controller 100 and a memory device 200.

The memory controller 100 may generally control the operation of the memory device 200. The memory controller 100 may provide various signals for controlling the memory device 200. For example, the memory controller 100 may provide a command CMD, an address ADDR, and a clock signal CLK. Further, the memory controller 100 may provide data DQ to the memory device 200 in response to a request from a host to write data or may read the data DQ from the memory device 200 and receive the data.

The memory controller 100 may provide the memory device 200 with an MRS command of instructing a mode register 232 to specify an operating mode of the memory device 200.

The memory controller 100 may receive an error information signal EIS from the memory device 200 and provide a write-back block signal WB_Block to the memory device 200. If the memory controller 100 determines that the data stored in the memory device 200 has a multi-bit error on the basis of the provided error information signal EIS, the memory controller 100 may provide the write-back block signal WB_Block to the memory device 200. This will be described below in detail referring to FIG. 2.

The memory device 200 may perform a memory operation in response to the command CMD, the address ADDR or the clock signal CLK from the memory controller 100. For example, the memory device 200 may perform read, write or erase operations.

Further, the memory device 200 may perform a data scrubbing operation. The data scrubbing operation of the memory device 200 may include reading of the data of the memory cell array, and writing-back of the data, in which an error detected from the read data is corrected, to the memory cell array. In example embodiments, the data scrubbing operation of the memory device 200 may be instructed by an external command such as a multi-purpose command from the memory controller 100. In example embodiments, the data scrubbing operation of the memory device 200 may be performed at regular cycles in an automatic mode, without a command from the memory controller 100.

The memory device 200 may include a volatile memory such as a DRAM. In addition, the memory device 200 may include a non-volatile memory such as a magnetoresistive random-access memory (MRAM), a resistive random-access memory (RRAM), a phase change random access memory (PRAM), and a NAND Flash. The type of memory device 200 may be changed according to various example embodiments. Hereinafter, although a case where the memory device 200 includes the DRAM will be described as an example, example embodiments are not limited thereto.

According to FIGS. 2 and 3, the memory device 200 may include a memory cell array 210, a row decoder 221, a sense amplifier unit 222, a column decoder 223, a control logic circuit 230, a command decoder 231, an address register 240, an error correction circuit 250, a data input/output buffer 260, a bank control logic 280, and an input/output gating circuit 290.

The memory cell array 210 may include first to eighth bank arrays 210a to 210h. Each of the first to eighth bank arrays 210a to 210h may include a plurality of memory cells MC formed at intersecting points of a plurality of word lines WL and a plurality of bit lines BL. Each memory cell MC may have a DRAM cell structure. A word line WL to which the memory cell MC is connected may be referred to as a row, and bit lines BL to which the memory cell MC is connected may be referred to as a column.

The row decoder 221 may include first to eighth bank row decoders 221a to 221h connected to each of the first to eighth bank arrays 210a to 210h. The row decoder 221 may receive the command from the command decoder 231 and receive a row address ADDR_R from the address register 240. The row decoder 221 may be connected to the memory cells MC through the word line WL. The row decoder 221 may select a memory cell MC which writes or reads data. The row decoder 221 may perform a selection operation on the word line WL of the memory cell array 210.

The sense amplifier unit 222 may include first to eighth bank sense amplifiers 222a to 222h connected to each of the first to eighth bank arrays 210a to 210h. The sense amplifier unit 222 may amplify the data of the memory cell selected by the row decoder 221 and the column decoder 223, and provide the amplified data to the data input/output buffer 260.

The column decoder 223 may include first to eighth bank column decoders 223a to 223h connected to each of the first to eighth bank arrays 210a to 210h. The column decoder 223 may receive a command from the command decoder 231 and receive the column address ADDR_C from the address register 240. The column decoder 223 may decode the column address ADDR_C and perform the selection operation on the bit line BL of the memory cell array 210. As an example, a column selection line (CSL) may be applied to the memory device 200 and the bit line BL selection operation through the column selection line CSL may be performed.

The control logic circuit 230 may control the operation of the memory device 200. For example, the control logic circuit 230 may generate internal control signals CTL1, CTL2 and CTL3 so that the memory device 200 performs a read operation or a write operation. For example, the control logic circuit 230 may generate a first internal control signal CTL1 that decodes the command CMD to control the input/output gating circuit 290, a second internal control signal CTL2 that controls the error correction circuit 250, and a third internal control signal CTL3 that controls the error information register 233.

The control logic circuit 230 may count error occurrences in units of memory cell row (page) based on the error occurrence signal EGS. The control logic circuit 230 may provide error information EINF to the error information register 233 on the basis of the error occurrence signal EGS. Here, the error information EINF may include information about address information, the number of error occurrences, the number of sub-pages including an error, and the like. The control logic circuit 230 controls the error information register 233 using a third control signal CTL3 such that the error information signal EIS including the error information of the memory cell row or sub-pages is sent to the memory controller 100.

The control logic circuit 230 may include a command decoder 231 that decodes the command CMD received from the memory controller 100, and a mode register 232 for setting the operating mode of the memory device 200.

The command decoder 231 may decode a command CMD input from the outside to generate one or more internal control signals for driving the memory device 200. The command decoder 231 may provide a write-back block internal signal iWB_Block, which is generated by decoding the write-back block signal WB_Block received from the memory controller 100, to the error correction circuit 250.

On the other hand, when the mode register 232 that receives the write-back block signal WB_Block from the memory controller 100 sets a mode that blocks the write-back of the error correction circuit 250, the command decoder 231 may not separately provide the write-back block internal signal iWB_Block to the error correction circuit 250.

The mode register 232 may set the internal mode in response to an MRS command for specifying the operating mode of the memory device 200. That is, the mode register 232 may convert the operating mode of the memory device 200. For example, when the write-back block signal WB_Block is provided from the memory controller 100, the mode register 232 may set a mode for blocking the write-back of the error correction circuit 250.

The error information register 233 may provide the error information signal EIS to the memory controller 100 in response to the third control signal CTL3 provided from the control logic circuit 230. Specifically, the error information register 233 may provide an error information signal EIS including the stored error information EINF to the memory controller 100.

The address register 240 may receive an address ADDR including a row address ADDR_R and a column address ADDR_C from the memory controller 100. The address register 240 may provide the received row address ADDR_R to the row decoder 221 and provide the received column address ADDR_C to the column decoder 223.

The data input/output buffer 260 may provide data DQ to the error correction circuit 250 on the basis of the clock signal CLK provided from the memory controller 100 in the write operation, and may provide data DQ, which is provided from the error correction circuit 250, to the memory controller 100 in the read operation.

The error correction circuit 250 may include an ECC encoder and an ECC decoder. The ECC encoder of the error correction circuit 250 may perform ECC encoding on the data to be written in the memory cell row of the memory cell array 210 under the control of the control logic circuit 230, and the ECC decoder of the error correction circuit 250 may perform ECC decoding on the code word CW that is read from the bank arrays 210a to 210h.

Specifically, the ECC encoder may perform error correction coding on the data to be written to the memory cell array 210 to form data to which parity bits are added. The parity bits may be stored in the memory cell array 210. Further, the ECC decoder may determine whether the error correction decoding is successful depending on the execution result, and may output an instruction signal depending on the determination result. The ECC decoder may correct error bits of the data, using the parity bits generated when performing the ECC encoding.

Figure 8:
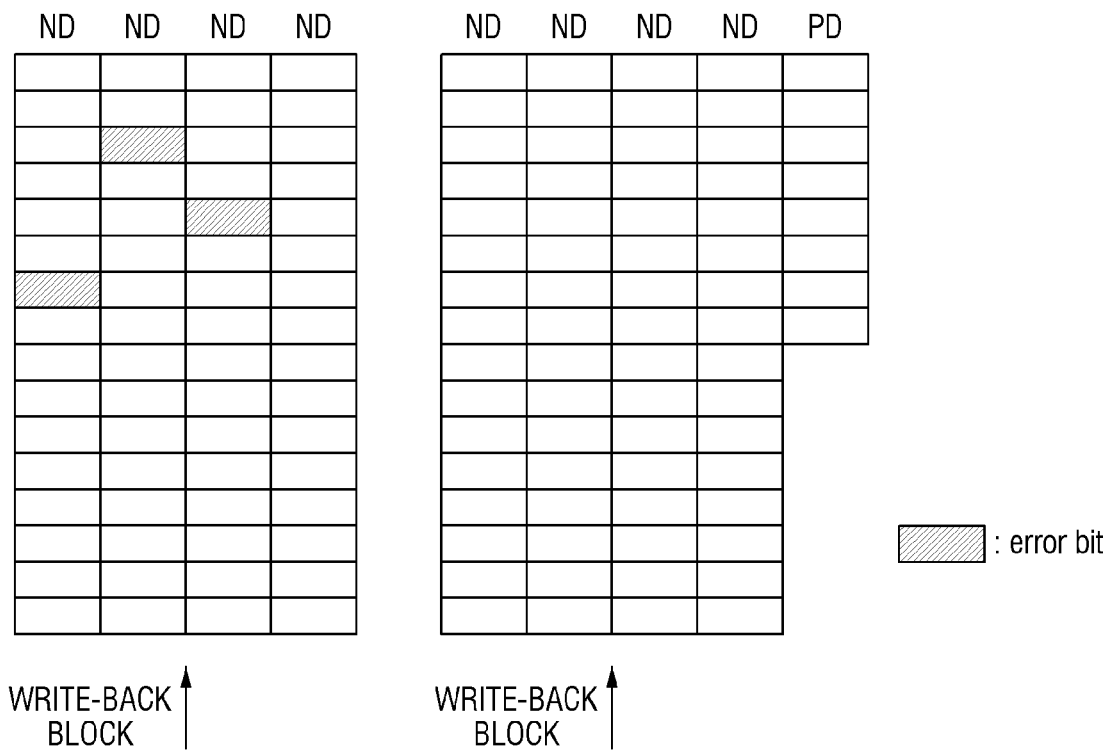
FIGS. 8 and 9 are diagrams for explaining the operation of the error correction circuit of the memory system according to example embodiments.
Figure 9:
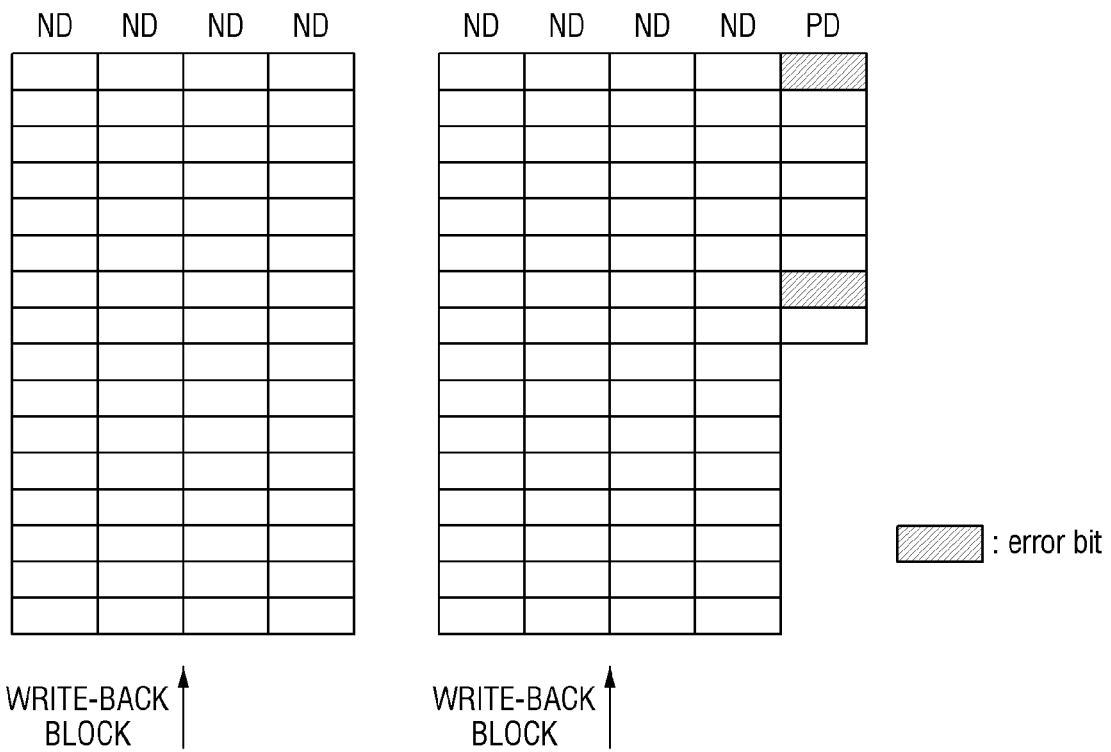

The error correction circuit 250 may perform ECC encoding or ECC decoding on the data of the bank arrays 210a to 210h in units of code word (CW of FIGS. 8 and 9). In example embodiments, the code word CW has a burst length of 16, and eight data I/O unit paths, and the code word CW may include 128-bit normal data (ND of FIGS. 8 and 9). Also, in example embodiments, the code word CW may include 8-bit parity data (PD of FIGS. 8 and 9).

The error correction circuit 250 controls a signal related to the error (e.g., an error occurrence signal EGS) to the control logic circuit 230, when an error is detected in the data of the code word CW as a result of performing the ECC decoding.

Figure 4:
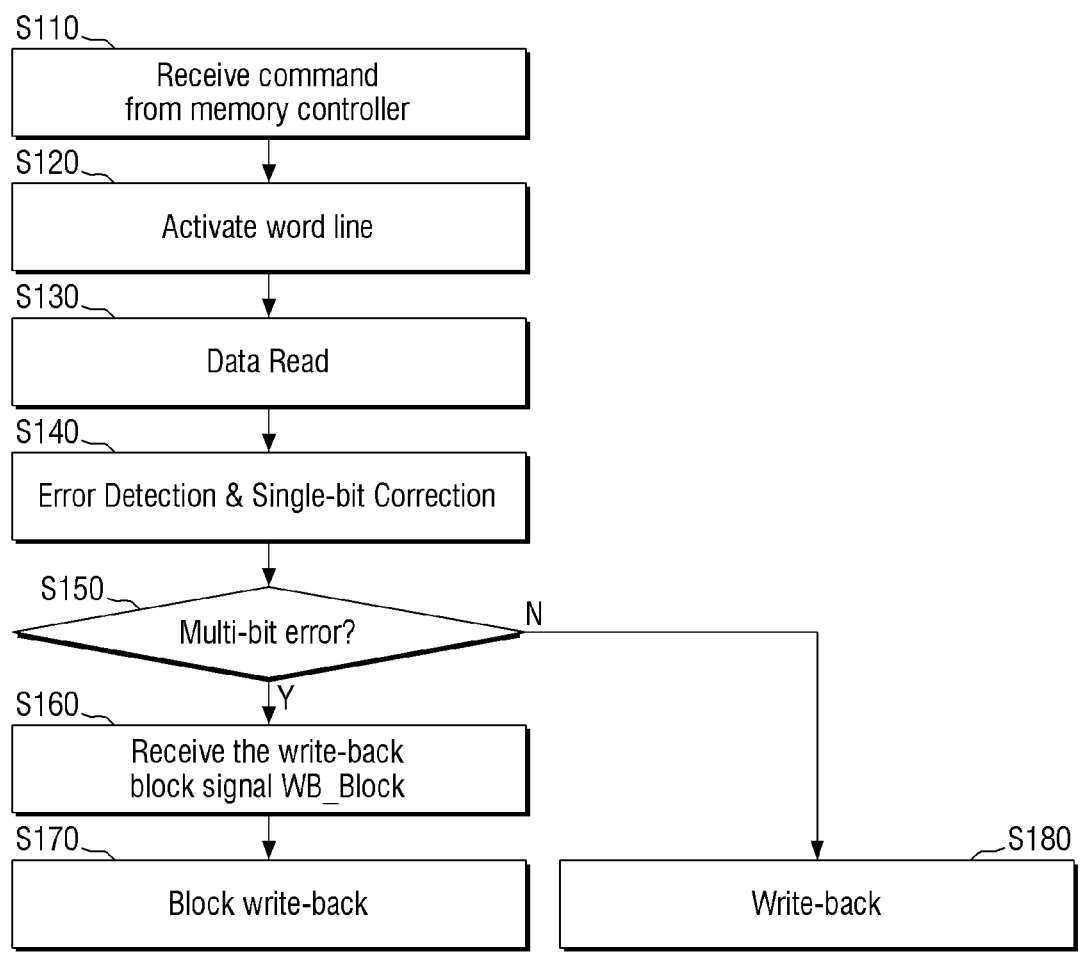
FIG. 4 is a flowchart for explaining the operation of the memory system according to example embodiments.
Figure 5:
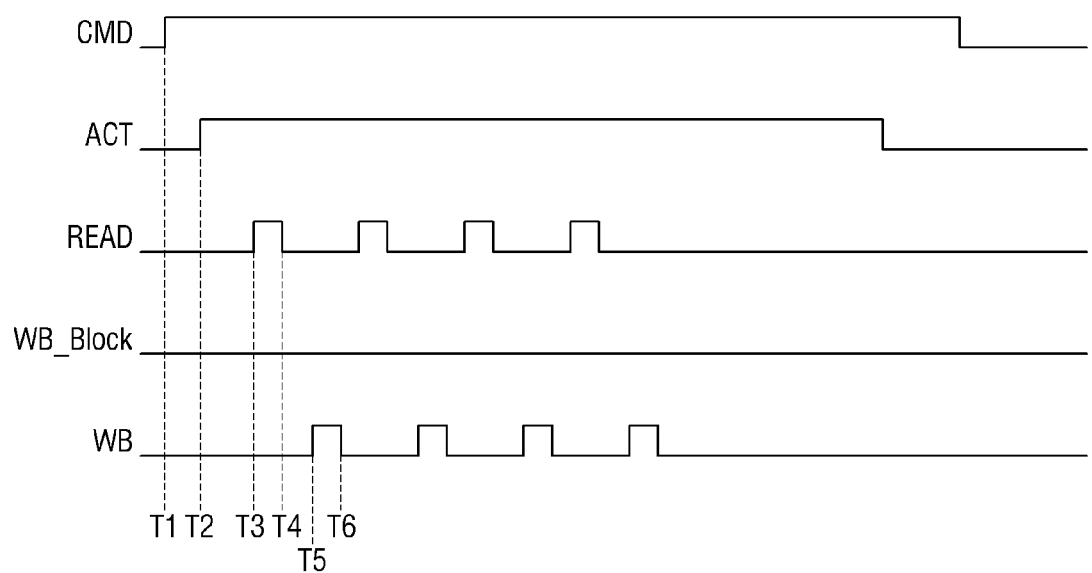
FIGS. 5 and 6 are timing diagrams for explaining the operation of the memory system according to example embodiments.
Figure 6:
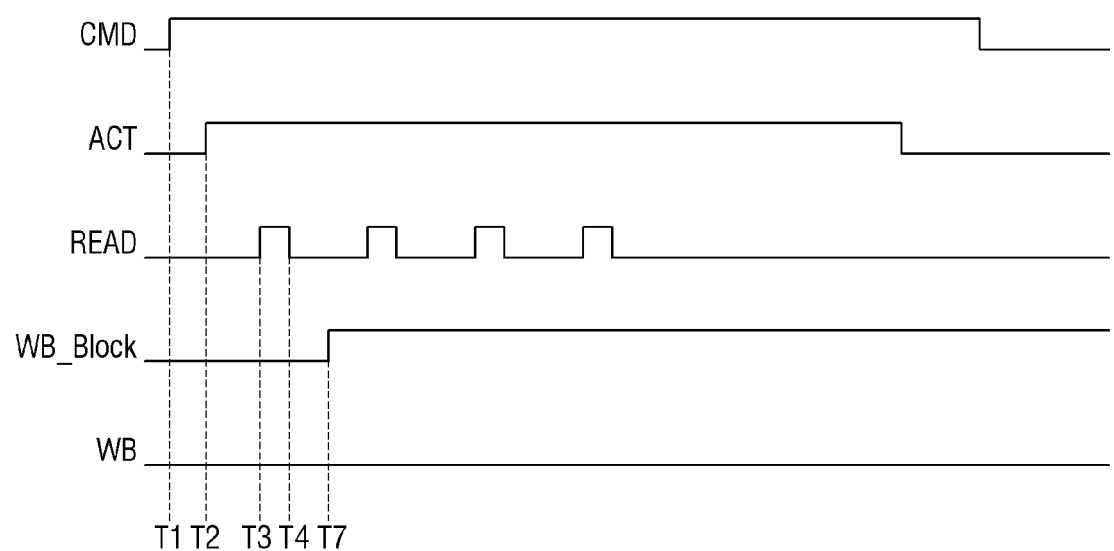
Figure 7:
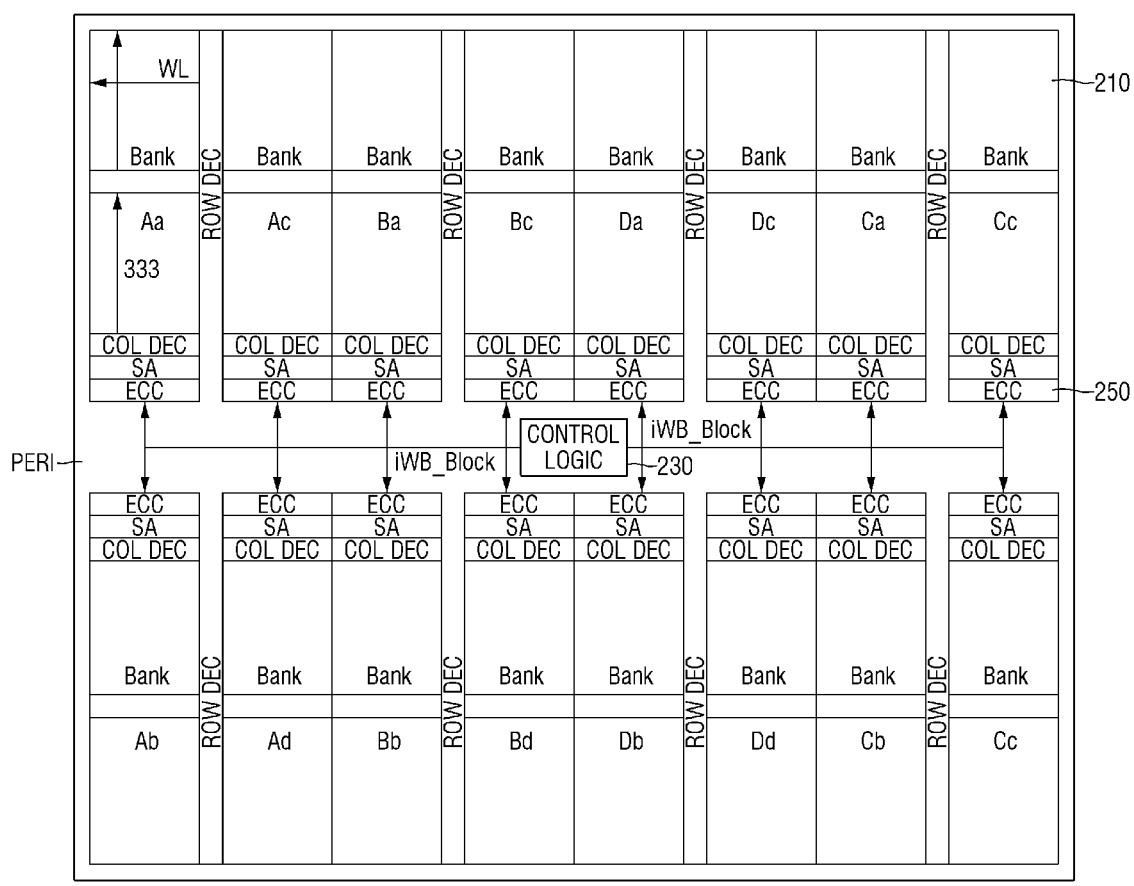
FIG. 7 shows a schematic layout of a memory device according to example embodiments.

FIG. 4 is a flowchart for explaining the operation of the memory system according to example embodiments. FIGS. 5 and 6 are timing diagrams for explaining the operation of the memory system according to example embodiments. FIG. 5 shows a case where the write-back of the error correction circuit 250 is not blocked. FIG. 6 shows a case where the write-back of the error correction circuit 250 is blocked. FIG. 7 shows a schematic layout of a memory device according to example embodiments. FIGS. 8 and 9 are diagrams for explaining the operation of the error correction circuit of the memory system according to example embodiments.

Referring to FIGS. 1 and 4 to 6, the memory controller 100 of the memory system 1 provides the command to the memory device 200 (S110). For example, if the memory controller 100 provides the command at a time point T1a, the command signal CMD may be enabled.

In example embodiments, the command provided by the memory controller 100 may include a refresh command. In example embodiments, the command provided by the memory controller 100 may include a command indicating scrubbing. The command provided by the memory controller 100 is not limited thereto, and may include commands instructing various memory operations of the memory device 200 except for the refresh command and the command of instructing the scrubbing.

Next, the memory device 200 activates the word line in response to the command received from the memory controller 100 (S120). At a time point T2, the signal that activates the word line ACT transitions from low to high, and the selected word line may be enabled.

Next, the memory device 200 reads the data of the memory cell connected to the word line activated at the operation S120 of the memory cell array 210 (S130). For example, the data read signal READ transitions from low to high to start reading at a time point T3, and the data read signal READ transitions from high to low to complete the reading at a time point T4. That is, the memory device 200 may read the data of the selected memory cell during the time between T3 and T4.

Next, the memory device 200 detects an error from the data that is read from the memory cell, and performs the single-bit correction (S140). Specifically, the error correction circuit 250 of the memory device 200 may detect an error included in the data that is read from the memory cell, and may perform the single-bit correction.

Next, the memory controller 100 determines whether the error detected at operation S140 is a multi-bit error (S150). Specifically, the memory controller 100 may determine whether an error detected by the error correction circuit 250 is a multi-bit error or a single-bit error, on the basis of the error information signal EIS received from the error information register 233 of the memory device 200.

Next, if the error detected at operation S150 is determined to be not a multi-bit error (i.e., a single-bit error), the error correction circuit 250 of the memory device 200 writes back the data subjected to single-bit correction at operation S140 on the memory cell (S180). For example, if the detected error is determined to be a single-bit error, the write-back block signal WB_Block is not enabled, and the write-back signal WB transitions from low to high and is enabled at a time point T5, the error correction circuit 250 may start writing back the data subjected to single-bit correction to the memory cell. If the write-back signal WB transitions from high to low again and is disabled at a time point T6, the error correction circuit 250 may terminate the write-back of the corrected data. That is, the error correction circuit 250 may write back the data subjected to single-bit correction on the selected memory cell during the time between the time points T5 and T6.

In contrast, if the error detected at operation S150 is determined to be a multi-bit error, the memory device 200 receives the write-back block signal WB_Block of the error correction circuit 250 (S160). Specifically, as shown in FIGS. 1 and 2, if the detected error is determined to be a multi-bit error, the memory controller 100 provides the write-back block signal WB_Block to the memory device 200.

Next, the write-back of the error correction data on the memory cell of the memory device 200 is blocked (S170). Specifically, the command decoder 231 may provide the error correction circuit 250 with the write-back block internal signal iWB_Block generated by decoding the write-back block signal WB_Block received from the memory controller 100 to block the write-back of the error correction circuit 250. When the error correction circuit 250 receives the write-back block internal signal iWB_Block from the command decoder 231, the error correction circuit 250 may not write back the data subjected to single-bit correction at operation S140 on the memory cell.

For example, when the write-back block signal WB_Block transitions from low to high and is enabled at a time point T7 in FIG. 6, the error correction circuit 250 is blocked from writing back the correction data. Accordingly, the data write-back signal WB is not enabled (i.e., disabled), and the error correction circuit 250 does not write back the corrected data generated by the single-bit correction on the memory cell.

Although FIG. 2 shows that the error correction circuit 250 receives the write-back block internal signal iWB_Block from the command decoder 231, example embodiments are not limited thereto. In another example, when the mode register 232 sets a mode that blocks the write-back of the error correction circuit 250 on the basis of the write-back block signal WB_Block received from the memory controller 100, even if the error correction circuit 250 receives another signal for blocking the write-back, the write-back operation of the error correction circuit 250 may be blocked.

Although FIGS. 5 and 6 show that, when signals such as a command CMD, a word line active signal ACT, a data read signal READ, a data write-back signal WB and a write-back block signal WB_Block are logical low (0), the signals correspond to a disabled status, and when the signals correspond to the logical high (1), the signals are enabled, example embodiments are not limited thereto. For example, the signals may be enabled when the signals correspond to the logical low (0). In another example, some of the plurality of digital signals are enabled when corresponding to the logical high (1), and others may be enabled when corresponding to the logical low (0).

Referring to FIGS. 2, 4 and 7 again, the memory device 200 may include a plurality of bank arrays 210a to 210h. A data line, a command/address pad block, a data pad block, and the like may be provided in a peri region PERI provided at the center of the memory device 200. A row decoder ROW DEC and a column decoder COL DEC may be provided around the bank arrays 210a to 210h to access the memory cells inside the bank arrays 210a to 210h.

Input/output fins to which commands and addresses may be input may be provided in the command/address pad block. Input/output pins to and from which data may be input and output may be provided in the data pad block.

At operation S160, the memory controller 100 may provide the write-back block signal WB_Block to the control logic circuit 230 when the code word CW includes a multi-bit error. Based on the write-back block signal WB_Block, the control logic circuit 230 may provide the write-back block internal signal iWB_Block to the error correction circuit 250. At this time, the control logic circuit 230 may integrally provide the write-back block internal signal iWB_Block to the error correction circuit 250 connected to the plurality of bank arrays 210a to 210h. That is, the control logic circuit 230 may integrally provide the write-back block internal signal iWB_Block to concurrently block each of the error correction circuits 250 of all the plurality of bank arrays 210a to 210h from being written back to.

Referring to FIG. 8, in example embodiments, as a result of performing the ECC decoding by the error correction circuit 250, the normal data ND included in the code word CW that is read from the memory cells included in the bank arrays 210a to 210h may include error bits. For example, as illustrated, the normal data ND may include more than one error bit, and may therefore include a multi-bit error.

Referring to FIG. 9, in example embodiment, the parity data PD included in the code word CW that is read from the parity cells included in the bank arrays 210a to 210h may include an error bit. For example, as illustrated, the parity data PD may include more than one error bit, and may therefore include a multi-bit error.

As shown in FIGS. 8 and 9, a code word CW may have 128 data bits and 8 parity bits. The code word CW may have a burst length of 16 (rows) and 8 DQ fins (columns) When a multi-bit error is detected in the code word CW, the write-back of the error correction circuit 250 may be blocked for the entire code word CW.

Although 8 and 9 show examples where only the normal data ND has a multi-bit error or only the parity data PD has a multi-bit error, example embodiments are not limited thereto. For example, a multi-bit error may be detected in both the normal data ND and the parity data PD that are included in the code words CW read from the memory cell and the parity cell of the memory cell array 210.

As shown in FIGS. 8 and 9, in a case where the normal data ND or the parity data PD of the code word CW includes a multi-bit error, when the error correction circuit 250 performs the single-bit correction operation on the detected error, the number of error bits may increase. That is, the error correction circuit 250 may miscorrect the data including the error bits. To avoid the miscorrection, the write-back of the error correction circuit 250 may be blocked when there is more than one error bit in a codeword (i.e., a multi-bit error). In a case where the write-back of the error correction circuit 250 is blocked (S160 of FIG. 4), even if the error correction circuit 250 reads the data (S130 of FIG. 4) and performs the single-bit correction of the detected error (S140 of FIG. 4), corrected data is not written back on the code word CW (S170 of FIG. 4). If the write-back of the error correction circuit 250 is blocked, it is possible to prevent the error from increasing due to miscorrection of the error correction circuit 250.

Although FIGS. 8 and 9 show that a burst length of the code word CW is 16, the number of data columns is eight, and the normal data ND of the code word CW read from the memory cell are 128 bits, example embodiments are not limited thereto. Further, although FIGS. 8 and 9 show that the parity data PD are 8 bits, example embodiments are not limited thereto. That is, the bits of the normal data ND and the parity data PD may be changed according to example embodiments.

Figure 10:
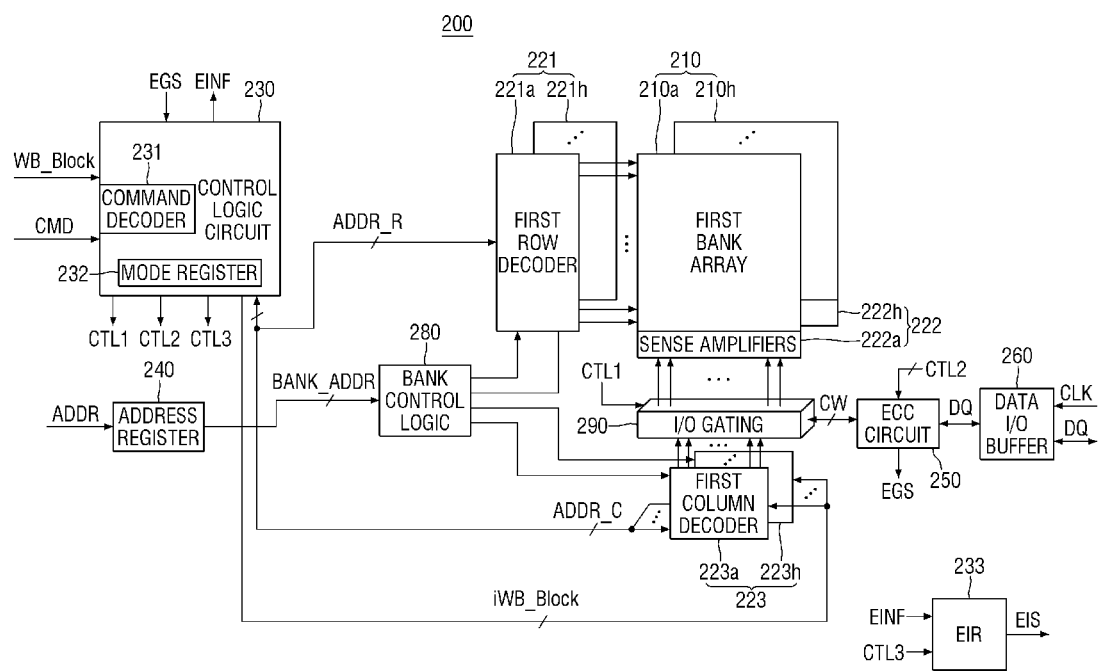
FIG. 10 is a diagram showing a memory device according to example embodiments.

FIG. 10 is a diagram showing a memory device according to example embodiments. For convenience of explanation, points different from those described referring to FIG. 2 will be mainly described.

Referring to FIG. 10, the control logic circuit 230 may provide the write-back block internal signal iWB_Block to the column decoder 223 rather than the error correction circuit 250 in response to the write-back block signal WB_Block that is received from the memory controller 100. Accordingly, the memory device 200 does not block the write-back of the error correction circuit 250 as a whole, but may control the bit line BL selection operation of the column decoder 223 to selectively block the write-back for individual bank arrays of the memory cell array 210. For example, the column decoder 223 may perform the selection operation on the bit line BL through the column selection line CSL.

Figure 11:
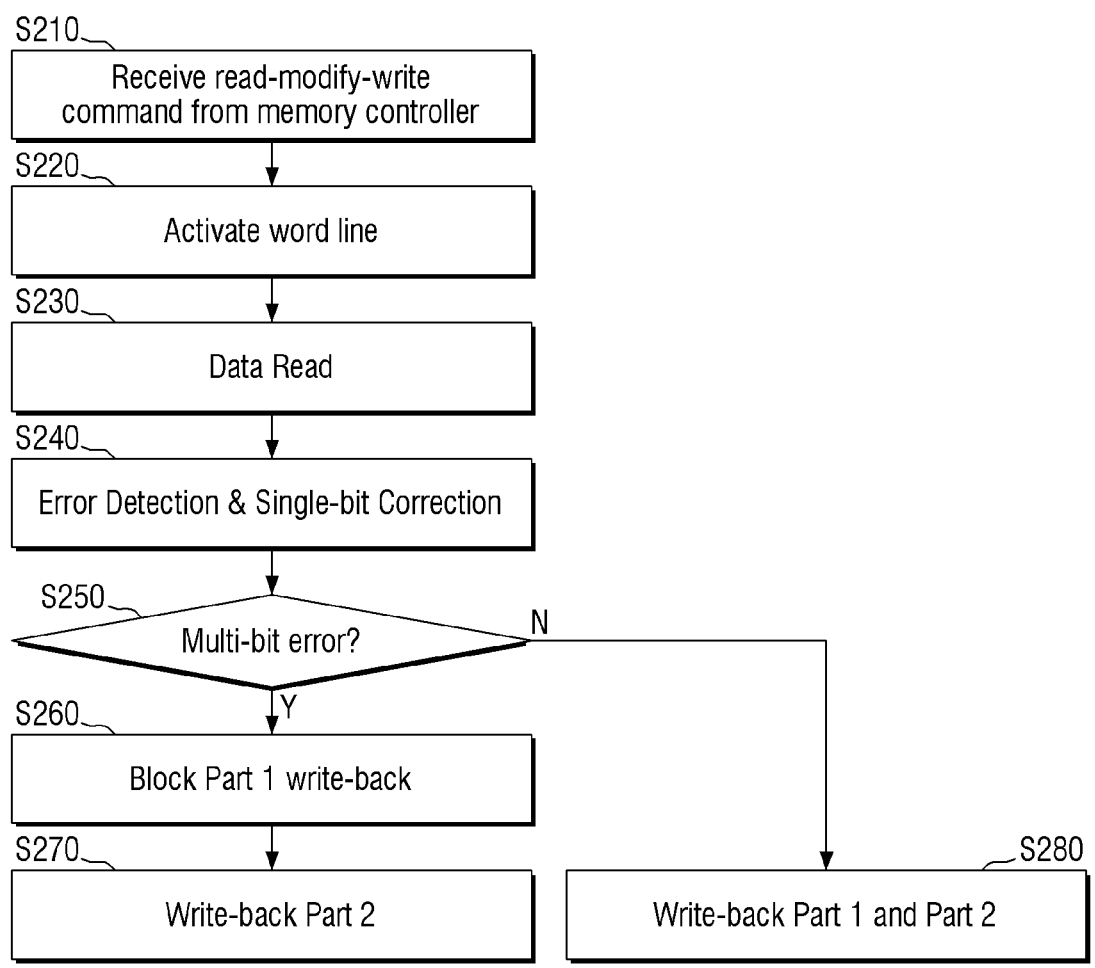
FIG. 11 is a flowchart for explaining the operation of the memory system according to example embodiments.
Figure 12:
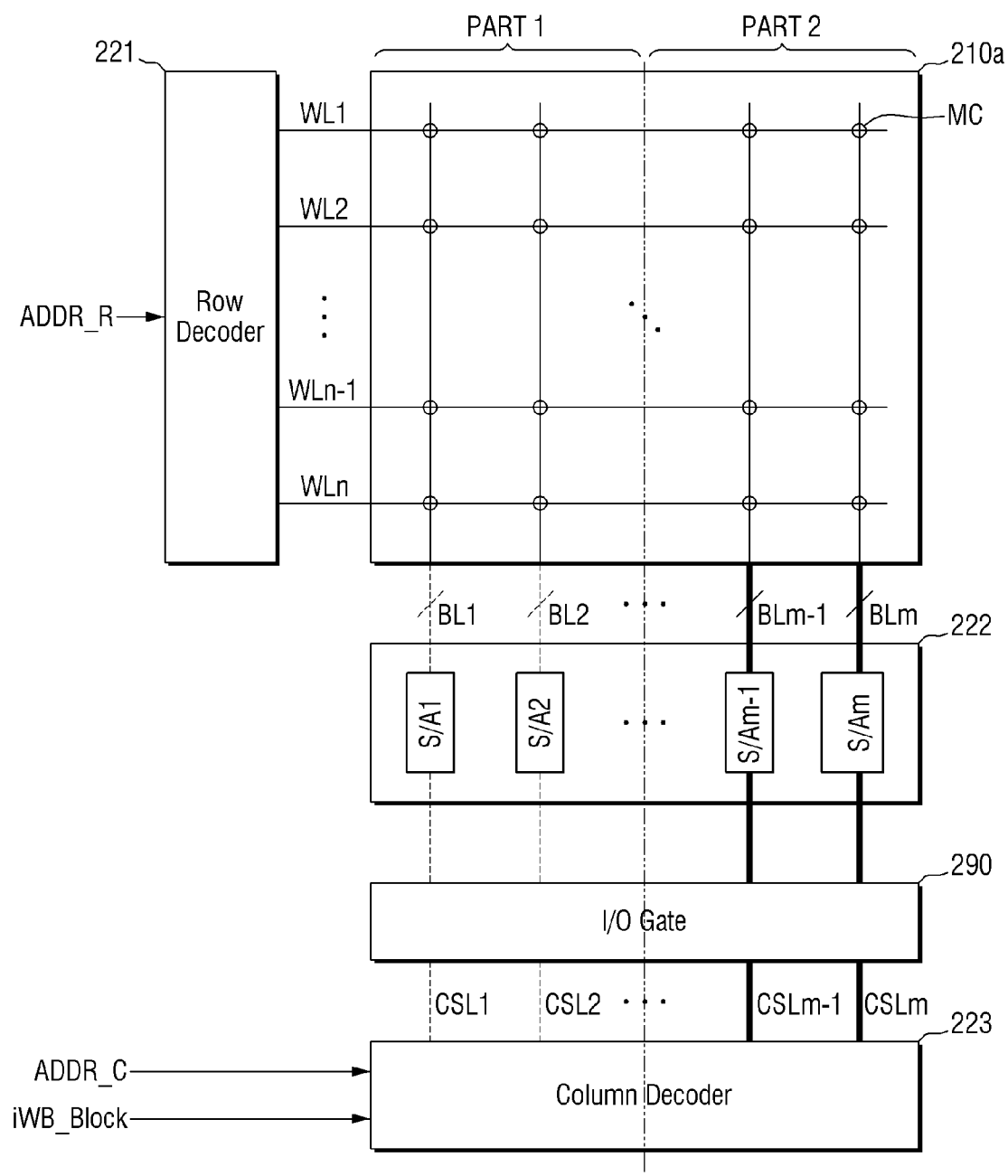
FIG. 12 is a diagram for explaining the operation of the memory system according to example embodiments.
Figure 13:
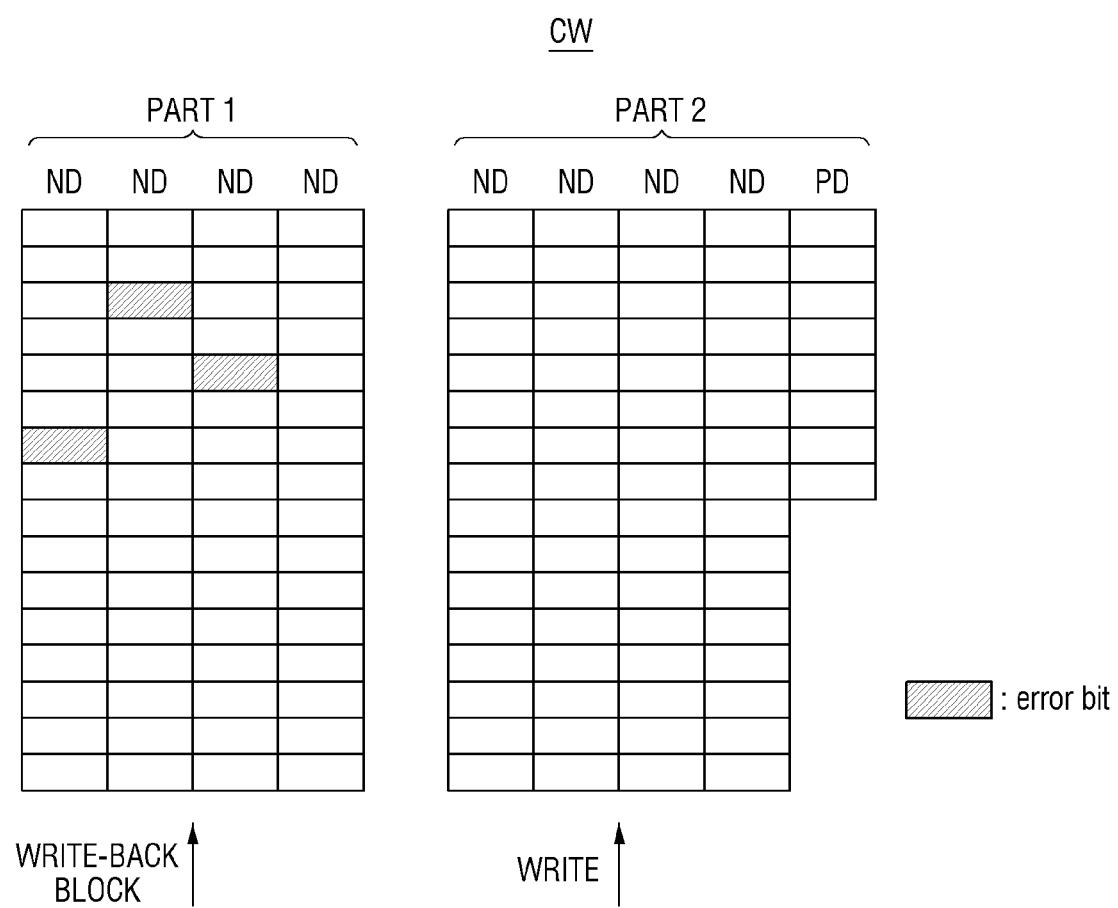
FIGS. 13 to 15 are diagrams for explaining the operation of the error correction circuit of the memory system according to example embodiments.
Figure 14:
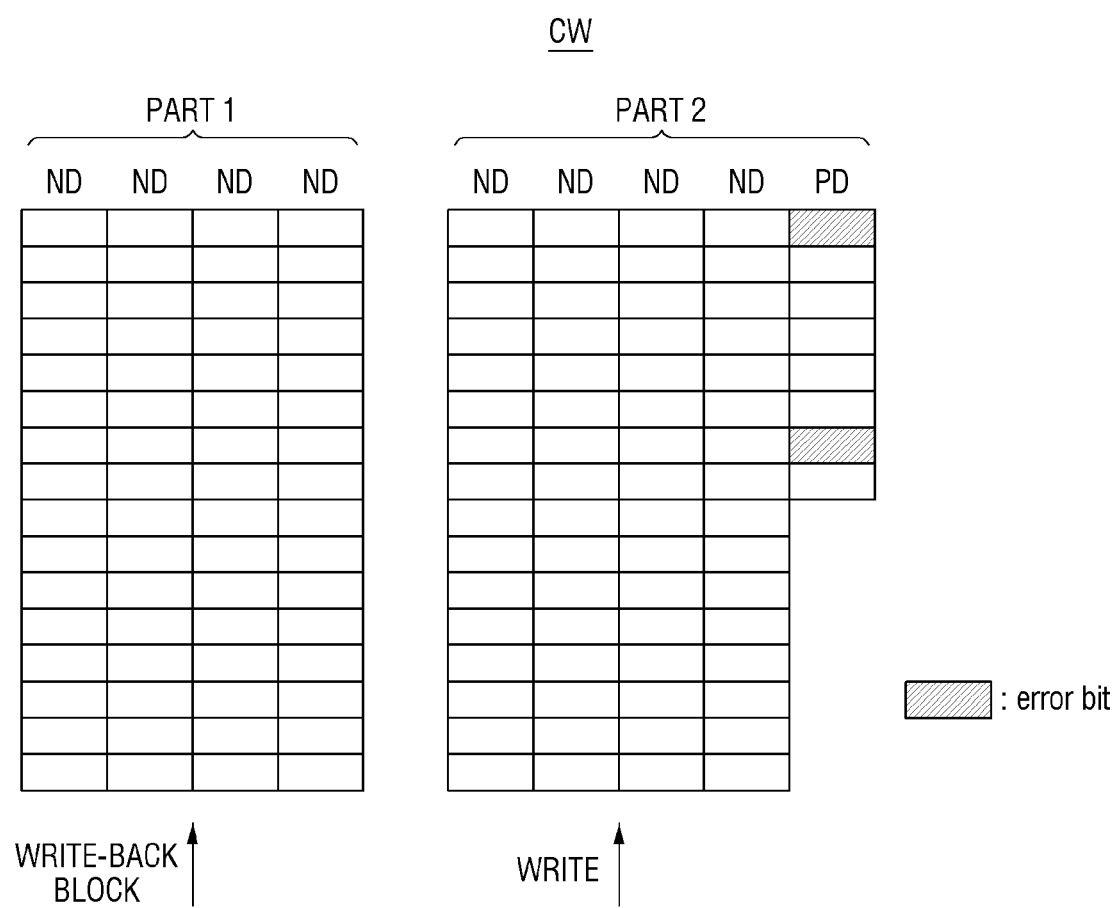
Figure 15:
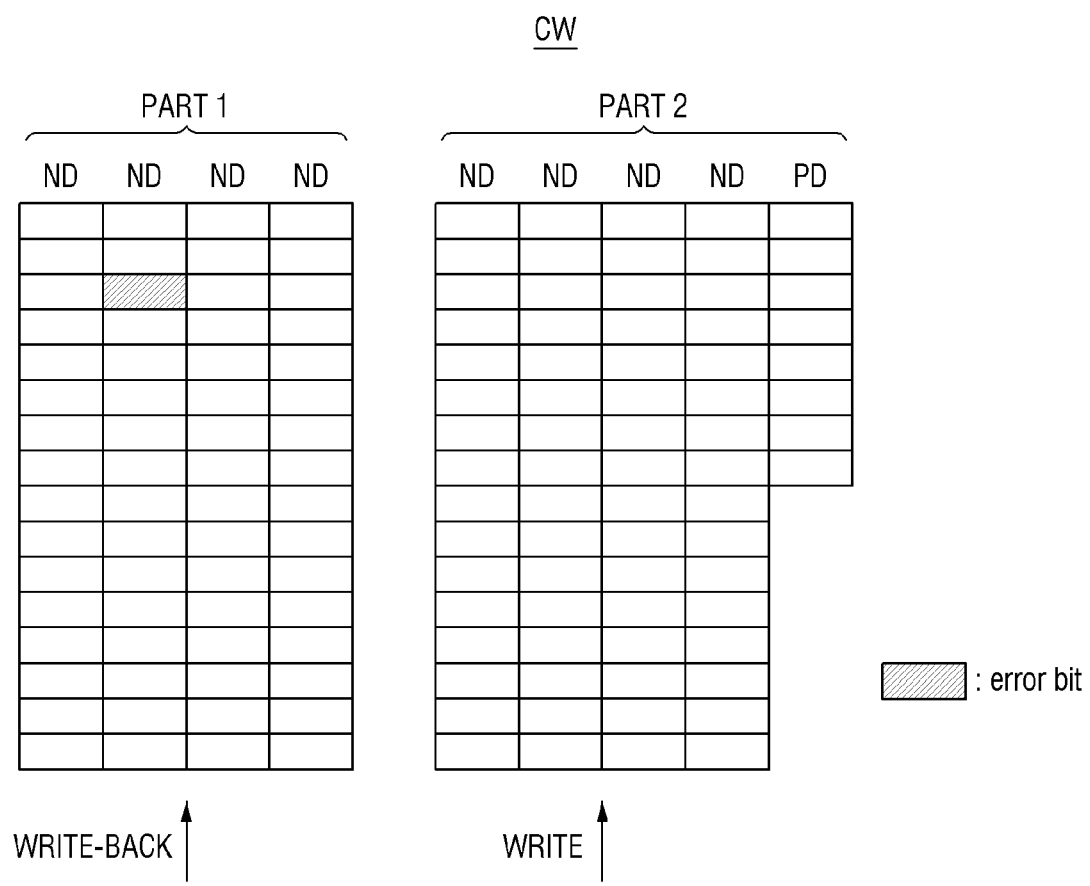

FIG. 11 is a flowchart for explaining the operation of the memory system according to example embodiments. FIG. 12 is a diagram for explaining the operation of the memory system according to example embodiments. FIGS. 13 to 15 are diagrams for explaining the operation of the error correction circuit of the memory system according to example embodiments.

Referring to FIGS. 11 to 14, the memory controller 100 of the memory system 1 provides a RMW (read-modify-write) command to the memory device 200 (S210). The RMW command may include, for example, a command for instructing to write the data only in some memory cells among the entire memory cells. For example, the RMW command may include a command for instructing to write new data in a first part (PART 1) and a second part (PART 2) of the bank array that is different from the first part (PART 1).

Next, the memory device 200 activates the word line in response to the command received from the memory controller 100 (S220).

Next, the memory device 200 reads the data of the selected memory cell of the memory cell array 210 (S230).

Next, the memory device 200 detects an error from the data that is read from the first part (PART 1) and performs a single-bit correction (S240).

Next, the memory controller 100 determines whether the error detected at operation S240 is a multi-bit error (S250).

Next, when the error detected at operation S250 is determined to be not a multi-bit error but a single-bit error, the error correction circuit 250 of the memory device 200 writes back the data subjected to single-bit correction at operation S240 on the first and second parts (i.e., PART 1 and PART 2) of the memory cell (S280).

In contrast, if the error detected at operation S250 is determined to be a multi-bit error, the write-back of the error correction circuit 250 is partially blocked (S260). Specifically, according to the write-back block signal WB_Block received from the memory controller 100, the error correction circuit 250 may not write back the correction data generated by single-bit correction at operation S240 on the first part (PART 1) of the bank array.

Specifically, when the column decoder 223 receives the write-back block internal signal iWB_Block from the control logic circuit 230, the column decoder 223 may control the column selection line CSL to inactivate the bit line BL connected to the memory cell MC of the first part (PART 1) of the bank array CSL 210a. When the bit line BL connected to the memory cell MC of the first part of the bank array 210a is inactivated, the corrected data may not be written back on the memory cell MC of the first part (PART 1) of the bank array 210a.

In the code word CW that is read in the first part (PART 1) of the bank array, the column decoder 223 controls the column selection line CSL to inactivate the bit line BL of the first part. Accordingly, the correction data subjected to single-bit correction is not written back on the code word CW that is read at the first part (PART 1) of the bank array, and thus, the error bit data may be maintained.

Next, the memory device 200 writes new data on the second part (PART 2) of the bank array (S270). Specifically, when the column decoder 223 receives the write-back block internal signal iWB_Block from the control logic circuit 230, the column decoder 223 may control the column selection line CSL to activate the bit line BL connected to the memory cell MC of the second part (PART 2) of the bank array 210a in which the write-back is not blocked.

When the bit line BL connected to the memory cell MC of the second part (PART 2) of the bank array 210a is activated, the data subjected to single-bit correction by the error correction circuit 250 may be written back, while writing new data on the memory cell MC of the second part (PART 2) of the bank array 210a.

Because the column decoder 223 controls the column selection line CSL to activate the bit line BL of the second part (PART 2), the input/output gating circuit 290 may write the received code word CW on the memory cell of the second part (PART 2) of the bank array through the write drivers.

Referring to FIGS. 11, 13 and 14, when the memory device 200 writes the data only on the second part of the bank array in accordance with the RMW command received at operation S210, and the error detected at operation S250 is determined to be a multi-bit error in data corresponding to the first part (PART 1), the write-back of the first part (PART 1) of the code word CW to be written on the first part (PART 1) except for the second part (PART 2) of the bank array may be blocked, and the write-back of the code word CW to be written on the second part (PART 2) of the bank array may be permitted.

On the other hand, referring to FIGS. 11 and 15, when the error detected at operation S250 is determined to be a single-bit error, the write-back of the first part (PART 1) of the code word CW to be written on the first part (PART 1) of the bank array may be performed by the error correction circuit 250.

Figure 16:
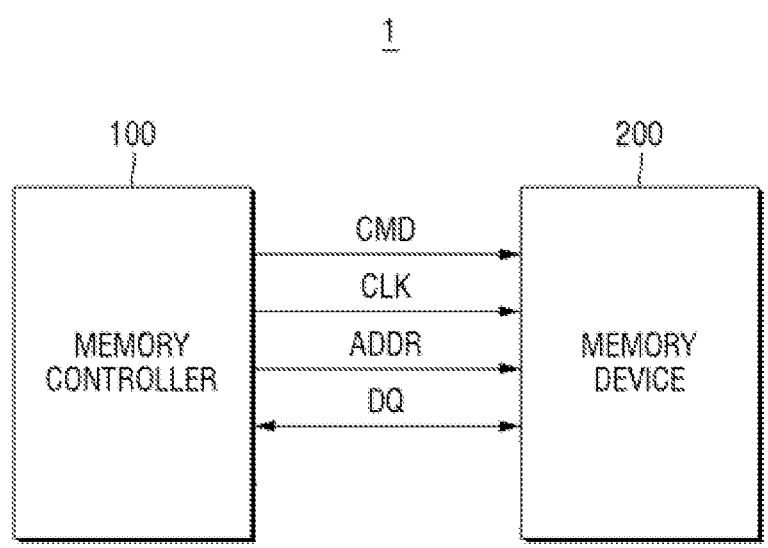
FIG. 16 is a diagram showing a memory system according to example embodiments.
Figure 17:
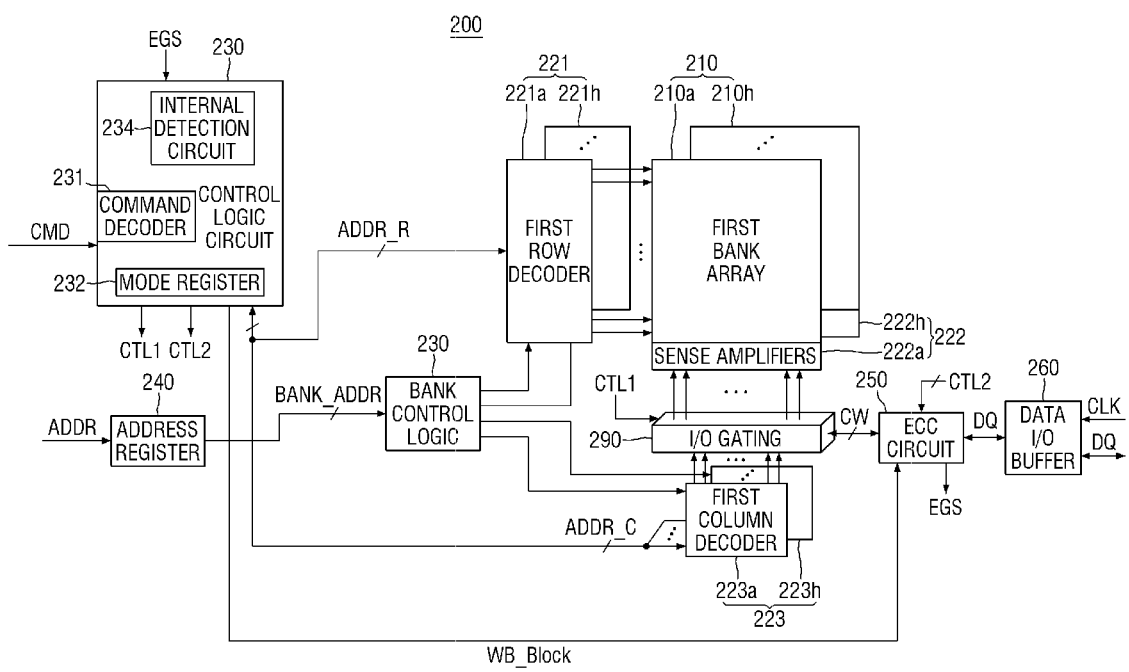
FIGS. 17 and 18 are diagrams showing a memory device according to example embodiments.
Figure 18:
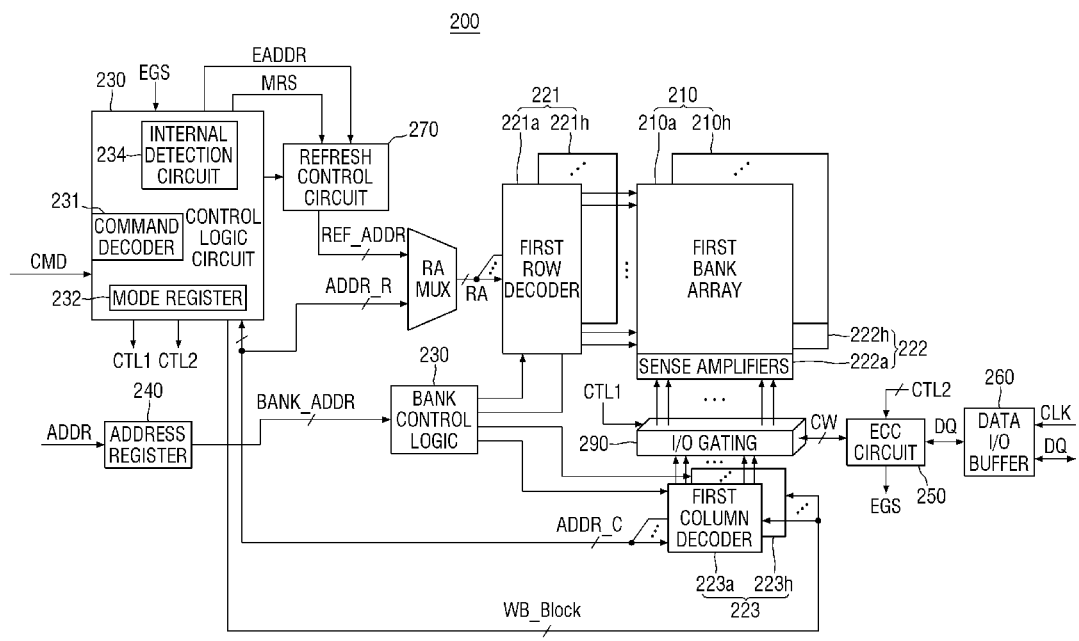

FIG. 16 is a diagram showing a memory system according to example embodiments. FIGS. 17 and 18 are diagrams showing a memory device according to example embodiments. For convenience of explanation, points different from those described referring to FIGS. 1, 2 and 10 will be mainly described.

According to FIGS. 16 and 17, the memory controller 100 and the memory device 200 may not send or receive the error information signal or the write-back block signal.

On the basis of the error occurrence signal EGS provided from the error correction circuit 250, the control logic circuit 230 may provide the write-back block signal WB_Block to the error correction circuit 250.

That is, the memory device 200 does not receive a command of indicating an error detected by the error correction circuit 250 or a command for controlling operation of the error correction circuit 250 from the memory controller 100, and the control logic circuit 230 may provide the error correction circuit 250 with the write-back block signal WB_Block, which is a signal for instructing the write-back block of the correction data of the error correction circuit 250 inside the memory device 200.

Specifically, the memory device 200 may include an internal detection circuit 234. The control logic circuit 230 of the memory device 200 may include an internal detection circuit 234. The internal detection circuit 234 may internally determine whether the error detected by the error correction circuit 250 is a multi-bit error or a single-bit error on the basis of the error occurrence signal EGS received from the error correction circuit 250.

If the internal detection circuit 234 determines the error detected by the error correction circuit 250 as a multi-bit error, the internal detection circuit 234 may provide the error correction circuit 250 with the write-back block signal WB_Block.

Although FIG. 17 shows that the write-back operation of the error correction circuit 250 is blocked by the write-back block signal WB_Block received from the control logic circuit 230, example embodiments are not limited thereto. For example, if the internal detection circuit 234 of the control logic circuit 230 determines the error detected by the error correction circuit 250 as a multi-bit error, the mode register 232 may set a mode for blocking the write-back of the error correction circuit 250 on the basis of the result determined by the internal detection circuit 234. In this case, the error correction circuit 250 does not receive another signal for blocking the write-back from the control logic circuit 230, and may not perform the write-back, depending on the write-back blocking mode that is set by the mode register 232.

Referring to FIG. 18, the memory device 200 may further include a refresh control circuit 270.

The refresh control circuit 270 may perform the refresh operation on the plurality of memory cell rows included in the memory cell array 210. In response to a first refresh control signal IREF1 or a second refresh control signal IREF2 provided from the control logic circuit 230 according to the command decoding result of the command decoder 231, the refresh control circuit 270 may sequentially output a refresh row address REF_ADDR. The refresh control circuit 270 may also store an error address EADDR provided from the control logic circuit 230 in an internal table.

When the memory device 200 performs the scrubbing operation in an automatic mode at regular cycles, the scrubbing operation of the memory device 200 may be instructed by the refresh control signals IREF1 and IREF2. That is, the scrubbing operation of the memory device 200 may be performed together with the refresh of the memory device 200. For example, the memory device 200 may detect and correct an error of the activated word line data, while generating a refresh effect by activating the word line of the bank array, and may write back the corrected data to the bank array. At this time, if the internal detection circuit 234 detects that an error detected through the error correction circuit 250 as a multi-bit error, the internal detection circuit 234 may provide the write-back block signal WB_Block to the column decoder 223. By controlling the bit line BL selection operation of the column decoder 223 on the basis of the write-back block signal WB_Block, the write-back of the scrubbing operation instructed by the refresh control signals IREF1 and IREF2 may be blocked.

When the memory device 200 performs the scrubbing operation in the automatic mode at regular cycles in response to the refresh control signals IREF1 and IREF2, refresh cycle information and scrubbing cycle information that are set in a test operation of the memory device 200 may be stored inside the memory chip including the memory device 200 in the non-volatile form. As the memory device 200 operates, when the refresh cycle information and the scrubbing cycle information stored inside the memory chip in the non-volatile form are provided to the memory controller 100, the memory controller 100 may provide the memory device 200 with commands decoded by the refresh control signals IREF1 and IREF2 at a cycle corresponding to that cycle information.

The mode register 232 may include a MRS code associated with the scrubbing operation. The mode register 232 may convert the mode so that the memory device 200 performs the scrubbing operation or does not perform the scrubbing operation, depending on the setting of the mode register 232. For example, when the mode register 232 is set to a mode which performs the scrubbing operation, the memory device 200 may perform the scrubbing operation together with the refresh operation in response to the refresh control signals IREF1 and IREF2. On the other hand, when the mode register 232 is set to the mode which does not perform the scrubbing operation, the memory device 200 performs only the refresh operation in response to the refresh control signals IREF1 and IREF2, and may not perform the scrubbing operation.

Figure 19:
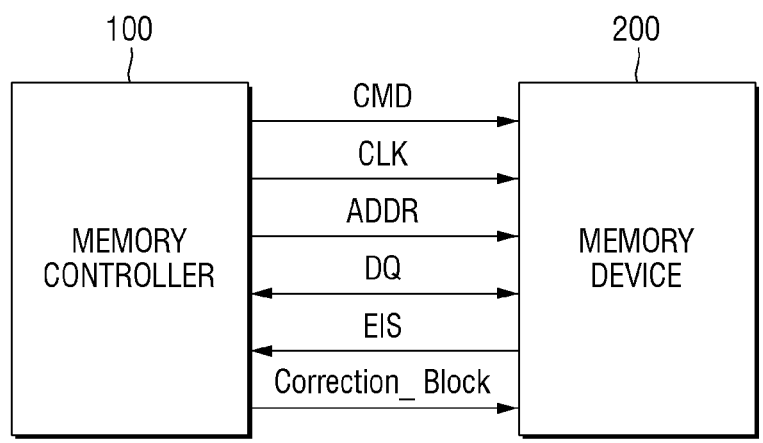
FIG. 19 is a diagram showing a memory system according to example embodiments.
Figure 20:
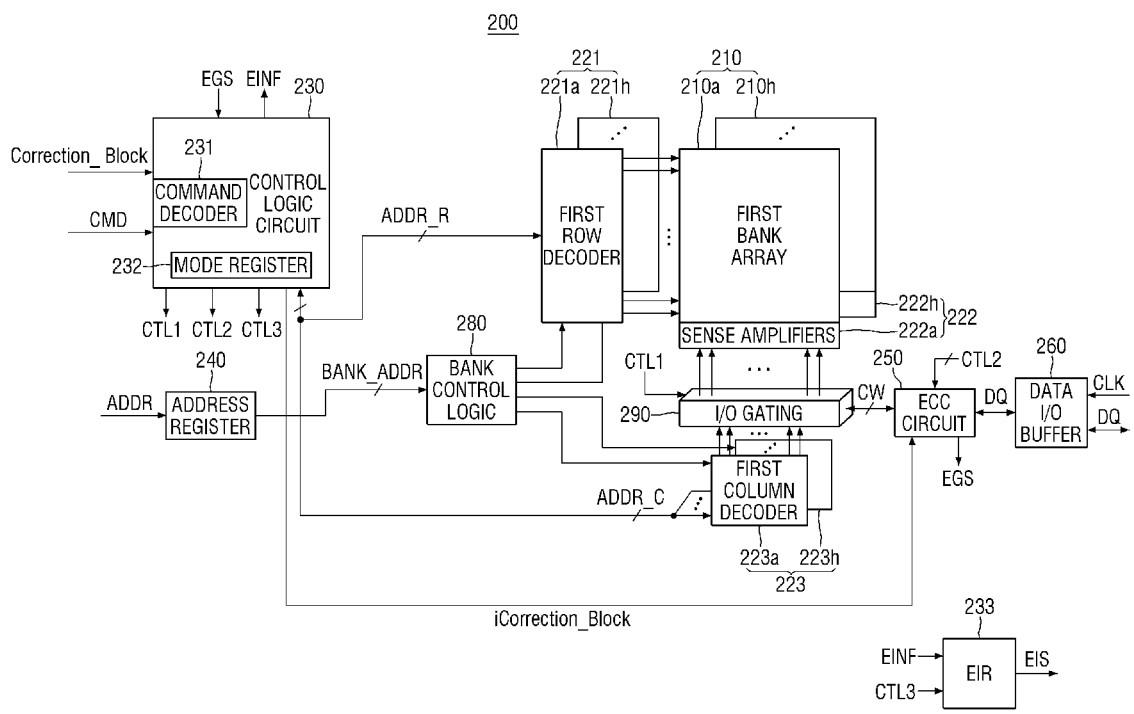
FIG. 20 is a diagram showing a memory device according to example embodiments.
Figure 21:
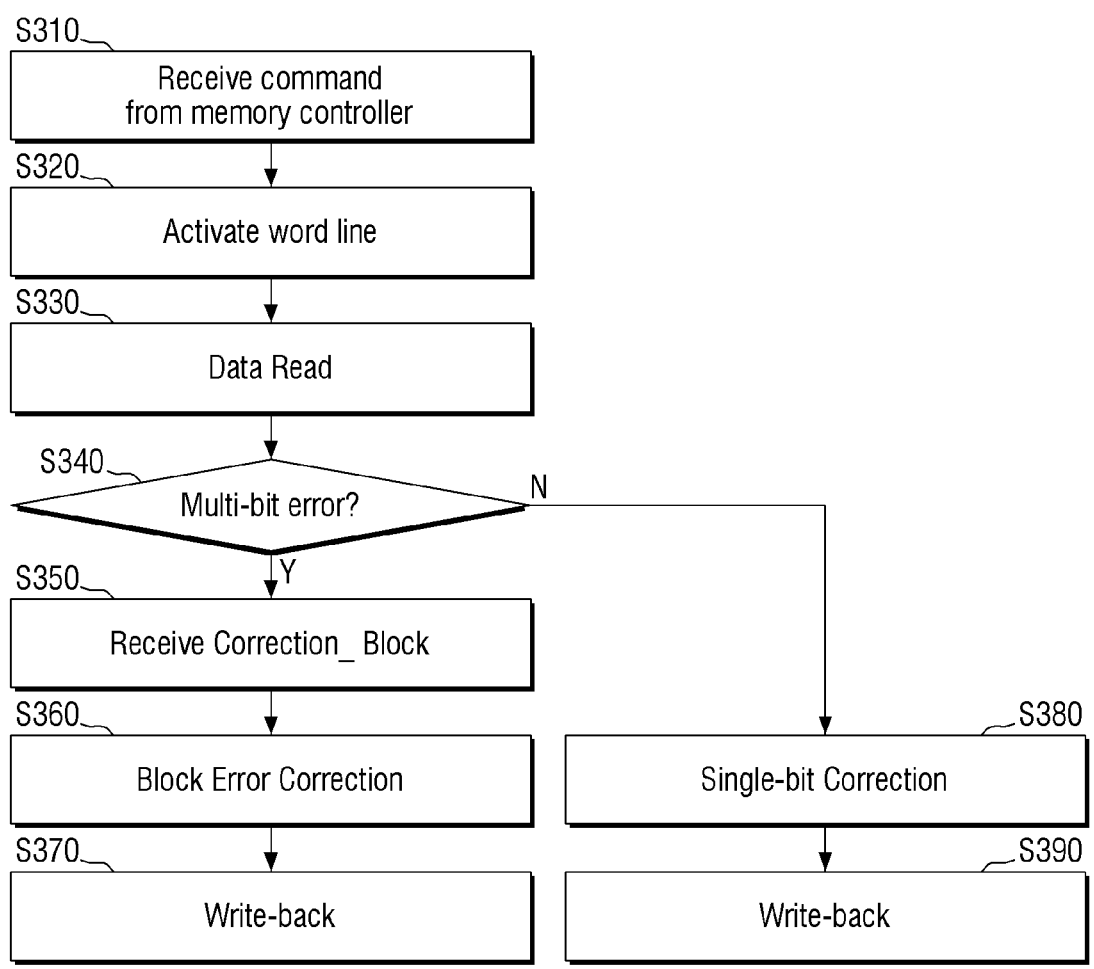
FIG. 21 is a flowchart for explaining the operation of the memory system according to example embodiments.

FIG. 19 is a diagram showing a memory system according to example embodiments. FIG. 20 is a diagram showing a memory device according to example embodiments. FIG. 21 is a flowchart for explaining the operation of the memory system according to example embodiments. For convenience of explanation, differences from those described referring to FIGS. 1, 2 and 4, those described referring to FIGS. 10 and 11, and those described referring to FIGS. 16 to 18 will be mainly described.

Referring to FIGS. 19 and 20, the memory controller 100 may receive an error information signal EIS from the memory device 200 and provide a correction block signal Correction_Block to the memory device 200. Specifically, on the basis of the received error information signal EIS, the memory controller 100 may provide the correction block signal Correction_Block to the memory device 200, when the error detected by the error correction circuit 250 is determined to be a multi-bit error.

The command decoder 231 of the control logic circuit 230 may provide the error correction circuit 250 with a correction block internal signal iCorrection_Block generated by decoding the correction block signal Correction_Block received from the memory controller 100.

The mode register 232 may set the internal mode in response to an MRS command for specifying the operating mode of the memory device 200. That is, the mode register 232 may convert the operating mode of the memory device 200. For example, when the correction block signal Correction_Block is received from the memory controller 100, the mode register 232 may set a mode which blocks the error correction operation of the error correction circuit 250.

Although FIG. 20 shows that the error correction operation of the error correction circuit 250 is blocked by the correction block internal signal iCorrection_Block received from the control logic circuit 230 of the memory device 200 on the basis of the correction block signal Correction_Block provided by the memory controller 100, example embodiments are not limited thereto.

For example, as shown in FIG. 17, the control logic circuit 230 of the memory device 200 includes an internal detection circuit 234, and when the internal detection circuit 234 determines an error detected by the error correction circuit 250 as a multi-bit error on the basis of the error occurrence signal EGS received from the error correction circuit 250, the correction block signal Correction_Block may be provided to the error correction circuit 250 to block the error correction of the error correction circuit 250.

Referring to FIG. 21, the memory controller 100 of the memory system 1 provides commands to the memory device 200 (S310).

Next, the memory device 200 activates the word line in response to the command received from the memory controller 100 (S320).

Next, the memory device 200 reads the data of the memory cell connected to the word line activated in S320 of the memory cell array 210 (S330).

Next, the memory controller 100 determines whether the data read at operation S330 has a multi-bit error (S340). Specifically, the error correction circuit 250 of the memory device 200 detects an error included in the data that is read from the memory cell, and the memory controller 100 determines whether the error detected by the error correction circuit 250 is a multi-bit error. For example, referring to FIGS. 19 and 20, the memory controller 100 may determine whether the error detected by the error correction circuit 250 is a multi-bit error or a single-bit error, on the basis of the error information signal EIS received from the error information register 233 of the memory device 200.

Next, if the error detected at operation S340 is determined to be a single-bit error, the error correction circuit 250 of the memory device 200 performs single-bit correction of the data that is read at operation S330 (S380).

Next, the error correction circuit 250 writes back the error correction data subjected to single-bit correction at operation S380 to the memory cell (S390).

In contrast, when an error detected at operation S340 is determined to be a multi-bit error, the memory device 200 receives a correction block signal Correction_Block that blocks the error correction of the error correction circuit 250 (S350). Specifically, as shown in FIG. 20, the control logic circuit 230 of the memory device 200 may receive the correction block signal Correction_Block from the memory controller 100.

Next, error correction of the read data of the memory device 200 is blocked (S360). Specifically, as shown in FIG. 20, the command decoder 231 may provide the error correction circuit 250 with the correction block internal signal iCorrection_Block generated by decoding the correction block signal Correction_Block received from the memory controller 100 to block the error correction of the error correction circuit 250. Even if the error correction circuit 250 detects an error from the code word CW that is read by ECC decoding, because the error correction is blocked, the error correction circuit 250 having a single-bit correction capability does not perform the single-bit correction of the data that is read from the memory cell.

Next, the memory device 200 writes back the data, which is read from the memory cell and does not correct an error, to the memory cell (S370). Specifically, the error correction circuit 250 may write back data that is not subjected to single-bit correction to the memory cell, using the code word CW.

When the code word CW includes a multi-bit error, if the error correction circuit 250 performs a single-bit correction operation on the detected error, the number of error bits may increase. Therefore, because the error correction of the error correction circuit 250 is blocked at operation S360, the error bit may not increase.

Figure 22:
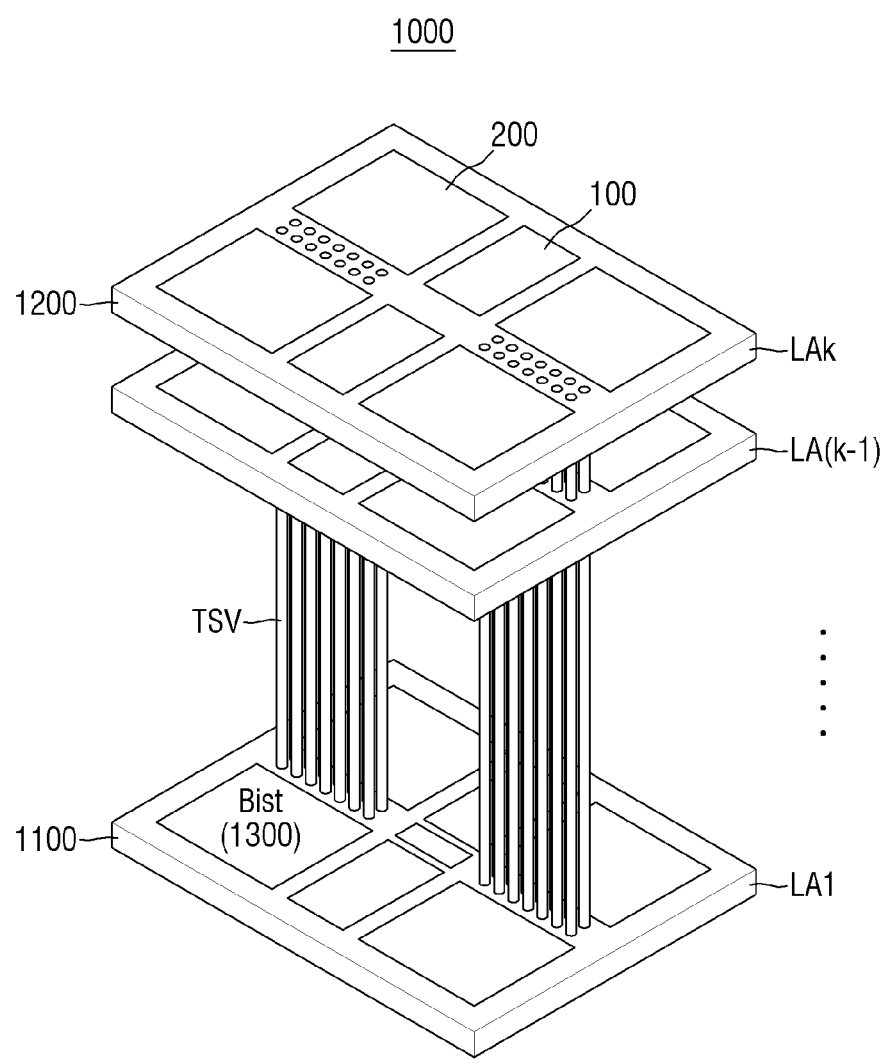
FIG. 22 is a diagram showing a memory chip including a memory system according to example embodiments.

FIG. 22 is a diagram showing a memory chip including a memory system according to example embodiments.

Referring to FIG. 22, the memory chip 1000 may include a large number of semiconductor layers LA1 to LAk. It may be assumed that a lowest semiconductor layer LA1 corresponds to a master chip, and the remaining semiconductor layers LA2 to LAk corresponds to a slave chip.

The large number of semiconductor layers LA1 to LAk transmit and receive signals to and from each other via a through silicon via TSV, and the master chip LA1 communicates with an external controller through a conductor formed on the outer side. The configuration and operation of the memory chip 1000 centering on a first semiconductor layer 1100 as the master chip and an $k^{th}$ semiconductor layer 1200 as the slave chip will be described below.

The first semiconductor layer 1100 includes various peripheral circuits for driving a memory region provided in the slave chips. For example, the first semiconductor layer 1100 may include a low driver for driving a word line of the memory, a column driver for driving a bit line of the memory, a data input/output unit for controlling the data input/output, a command decoder that receives commands from the outside, an address buffer that receives and buffers addresses from the outside, and the like. Further, the first semiconductor layer 1100 may further include refresh control logic for controlling the refresh operation of the slave chip. The refresh control logic is configured like a refresh control circuit and may control the refresh operation of the slave chip. Further, the first semiconductor layer 1100 may include built-in self-test (BIST) logic 1300 for testing the functions in the memory chip 1000 in a built-in manner. Depending on the test result of BIST logic 1300, the data retention time of the memory cell rows of the memory cell array may be judged and stored in a table unit of the refresh control logic for each refresh time zone.

On the other hand, the $k^{th}$ semiconductor layer 1200 may include a memory region including the memory cell array, and a peripheral circuit region in which other peripheral circuits for reading/writing data of the memory region, for example, a row decoder, a column decoder, a bit line sense amplifier, and the like are provided.

A cycle at which the data scrubbing operation is performed by the BIST logic 1300 may be built-in (i.e., preset) inside the memory device. If the data scrubbing operation is not instructed by a new command for instructing the scrubbing operation and but is performed by the refresh control circuit, the BIST logic may include the cycle of the data scrubbing operation performed by the refresh control circuit, or the like.

Depending on the test results of the BIST logic 1300, if there is a multi-bit error in the data that is read from the memory cell array, an operation which corrects and writes back the detected error may be blocked.

Figure 23:
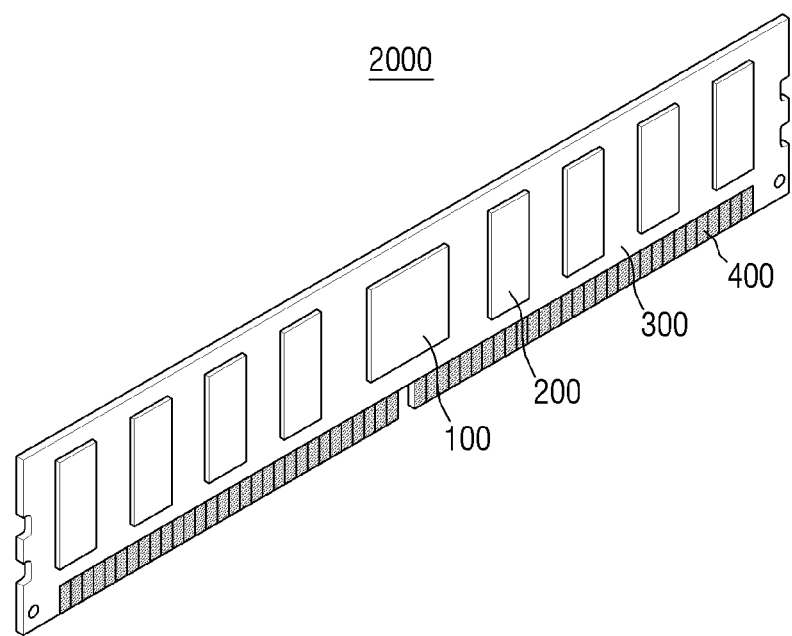
FIG. 23 is a diagram showing a memory device including the memory system according to example embodiments.

FIG. 23 is a diagram showing a memory device including the memory system according to example embodiments.

Referring to FIG. 23, a memory device 2000 may include a plurality of memory chips 200 mounted on the substrate 300. The memory device 2000 may further include a memory controller 100 that provides the command CMD and the address ADDR to a plurality of memory chips 200, and input/output pads 400 provided at one end of the substrate 300. The input/output pads 400 may be connected to the respective data input/output DQ paths of the plurality of memory chips 200.

The memory chip 200 includes an error correction circuit, and may perform the scrubbing operation and the error correction operation according to the above-described example embodiments.

Although FIG. 23 shows that the memory device 2000 includes eight memory chips 200, this is an example, and example embodiments are not limited thereto. The number of memory chips 200 may vary depending on the respective data storage capacity of the memory device 2000 or the memory chips 200. For example, the memory device 2000 may include sixteen memory chips 200. If a memory device including the eighth memory chips and a memory device including the sixteen memory chips have the same data storage capacity, the data storage capacity of the eight memory chips may be twice the data storage capacity of the sixteen memory chips. Also, the number of data input/output DQ paths connected to each of the memory chips of the memory device including the eight memory chips may be twice the number of data input/output paths connected to each of the memory chips of the memory device including the sixteen memory chips.

While example embodiments have been particularly shown and described, it will be understood that various changes in form and details may be made therein without departing from the spirit and scope of the following claims.

What is claimed is:

1. A method of operating a memory device, the method comprising:
receiving a first command from a controller;
activating a page of a memory cell array based on the first command;
reading data of the activated page;
detecting an error from the read data;
correcting the detected error to generate error correction data;
writing back the error correction data to the activated page based on the detected error being a single-bit error; and
controlling an error correction circuit of the memory device to receive a second command of blocking the write-back from the controller based on the detected error being a multi-bit error and to block write-back of the error correction data to the activated page based on the second command.

2. The method of operating the memory device of claim 1, further comprising:
determining, by the controller, whether the detected error is the multi-bit error; and
providing, by the controller, the memory device with the second command based on the detected error being the multi-bit error.

3. The method of operating the memory device of claim 1, wherein the activated page comprises a data cell and a parity cell, and
wherein the controlling to block the write-back of the error correction data comprises blocking the write-back of the error correction data based on the detected error being in the parity cell.

4. The method of operating the memory device of claim 1, wherein the activated page comprises a first region and a second region, and
wherein the controlling to block the write-back of the error correction data comprises:
writing new data to the first region; and
blocking the write-back of the error correction data to the second region.

5. The method of operating the memory device of claim 1, wherein the memory cell array comprises a plurality of bank arrays,
wherein the page is provided in the plurality of bank arrays, and
wherein the controlling to block the write-back of the error correction data comprises blocking the write-back of the error correction data to each of the plurality of bank arrays.

6. The method of operating the memory device of claim 1, wherein the memory cell array comprises a plurality of bank arrays, each of which comprises a plurality of pages, and
wherein a first page of a first bank array of the plurality of bank arrays is permitted to write-back the error correction data while the write-back of the error correction data is blocked on a second page of the first bank array.

7. A method of operating a memory controller, the method comprising:
transmitting a read-modify-write command to a memory device;
receiving an error information signal indicating an error detected from data read from a memory cell array of the memory device, from the memory device;
determining whether the data read from the memory cell array comprises a multi-bit error based on the error information signal, by the memory controller; and
providing the memory device with a write-back block signal to control an error correction circuit of the memory device to block the memory device from writing back an error correction data obtained by correcting the detected error to the memory cell array, based on the error information signal indicating the detected error is the multi-bit error.

8. The method of operating the memory controller of claim 7, further comprising transmitting a scrubbing command instructing scrubbing of data stored in the memory cell array, with the read-modify-write command.

9. The method of operating the memory controller of claim 7, wherein the memory cell array comprises a first region and a second region,
wherein the write-back block signal controls the memory device to block write-back of the error correction data to the first region of the memory device, and
wherein the write-back block signal controls the memory device to permit write-back of the error correction data to the second region of the memory device.

10. The method of operating the memory controller of claim 7, wherein the memory cell array comprises a plurality of bank arrays, and
wherein the write-back block signal controls the memory device to block writing back the error correction data to each of the plurality of bank arrays.

11. The method of operating the memory controller of claim 7, wherein the memory cell array comprises a plurality of bank arrays, each of which comprises a plurality of pages, and
wherein the write-back block signal controls the memory device to permit writing-back the error correction data to a first page of a first bank array of the plurality of bank arrays to and block writing back the error correction data to a second page of the first bank array.

12. The method of operating the memory controller of claim 7, wherein the memory cell array comprises a data cell and a parity cell, and wherein the providing the write-back block signal to the memory device comprises providing the memory device with the write-back block signal to control the memory device to block writing back the error correction data to the memory cell array, based on the parity cell comprising the multi-bit error.

13. A memory system comprising:

a memory controller; and a memory device comprising a plurality of bank arrays provided in a memory cell array, and an error correction circuit, wherein the memory device is configured to perform a memory operation based on a first command received from the memory controller, wherein the error correction circuit is configured to perform a scrubbing operation which comprises detecting an error of data read from the memory cell array, correcting the detected error to generate error correction data, and writing back the error correction data to the memory cell array, wherein the memory controller is configured to provide the memory device with a second command to block the scrubbing operation based on the error detected by the error correction circuit being a multi-bit error, and wherein the memory device is configured to control the error correction circuit to receive the second command from the memory controller based on the detected error being the multi-bit error and to block the error correction circuit from writing back the error correction data to the memory cell array based on the second command.

14. The memory system of claim 13, wherein the second command is configured to block the error correction circuit from writing back the error correction data to the memory cell array.

15. The memory system of claim 14, wherein the second command is configured to block the error correction circuit from writing back the error correction data to each of the plurality of bank arrays.

16. The memory system of claim 14, wherein each of the plurality of bank arrays comprises a plurality of pages, and wherein the second command is configured to block the error correction circuit from writing back the error correction data to a first page of a first bank array among the plurality of bank arrays and to permit the error correction circuit to write back the error correction data to a second page of the first bank array.

17. The memory system of claim 14, wherein the memory cell array comprises a first region and a second region, and wherein the second command is configured to block the error correction circuit from writing back the error correction data to the first region, and permit the error correction circuit to write back the error correction data to the second region.

* * * * *